United States Patent
Ikegami

(10) Patent No.: US 6,816,828 B1
(45) Date of Patent: Nov. 9, 2004

(54) LOGIC SIMULATION METHOD IN WHICH SIMULATION IS DYNAMICALLY SWITCHABLE BETWEEN MODELS

(75) Inventor: Hiroyuki Ikegami, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/517,604

(22) Filed: Mar. 2, 2000

(30) Foreign Application Priority Data

Mar. 4, 1999 (JP) .......................................... 11-057040

(51) Int. Cl.$^7$ .............................................. G06F 17/50
(52) U.S. Cl. .............................. 703/15; 703/2; 703/13; 703/14; 716/1; 716/18
(58) Field of Search .......................... 703/2, 15; 716/1, 716/18

(56) References Cited

U.S. PATENT DOCUMENTS

| | | | |
|---|---|---|---|
| 5,572,437 A | * 11/1996 | Rostoker et al. | ............... 716/18 |
| 5,598,344 A | * 1/1997 | Dangelo et al. | ............... 716/18 |
| 5,634,003 A | * 5/1997 | Saitoh et al. | .................. 703/15 |
| 5,701,439 A | 12/1997 | James et al. | |
| 5,801,958 A | * 9/1998 | Dangelo et al. | ............... 716/18 |
| 5,870,308 A | * 2/1999 | Dangelo et al. | ............... 716/18 |
| 5,910,898 A | * 6/1999 | Johannsen | ....................... 716/1 |
| 6,044,211 A | * 3/2000 | Jain | ............................ 716/18 |
| 6,161,211 A | 12/2000 | Southgate | |
| 6,470,482 B1 | * 10/2002 | Rostoker et al. | ................ 716/6 |

OTHER PUBLICATIONS

"Digital System Simulation: Methodologies and Examples", K. Olukotun, DAC 98, ISBN 1–58113–049–x/98/06, Jun., 1998.*

"Power Minimization in IC Design: Principles and Applications", M. Pedram, ACM 1084–4309/96/0100–0003, 1996.*

"Fast Hierarchical Multi–Level Fault Simulation of Sequential Circuits with Swtich–Level Accuracy", W. Meyer, ACM/IEEE Desig Automation Conference, 0–89791–577, 1.*

"Fast Hierarchical Multi–Level Fault Simulation of Sequential Circuits with Swtich–Level Accuracy", W. Meyer, ACM/IEEE Design Automation Conference, 0–89791–577, 1.*

"Dynamic multi–level simulation of digital hardware designs", Simulation, SCS, Jun. 1987, vol. 48, No. 6, pp. 247–252.

"The hierarchy level logical simulation machine MAN–YO", bit, parallel computer architecture, Kyoritsu shuppan, Mar. 1989, vol. 21, No. 4, pp. 476–685.

* cited by examiner

Primary Examiner—Kevin J. Teska
Assistant Examiner—Fred Ferris
(74) Attorney, Agent, or Firm—Katten Muchin Zavis Rosenman

(57) ABSTRACT

In a logic simulation method, one of an algorithm level simulation and a register transfer level simulation is executed. The algorithm level simulation corresponds to an algorithm level description and the register transfer level simulation corresponds to a register transfer level description. The simulation is switched from one of the algorithm level simulation and the register transfer level simulation into the other in response to a switching instruction using a relation between states of the algorithm level description and states of the register transfer level description. The algorithm level description is associated with arithmetic and logic algorithm and not associated with logic circuits. The register transfer level description is associated with logic circuits.

30 Claims, 13 Drawing Sheets

Fig. 4

C LANGUAGE PROGRAM

```
Calc(int a,b,c,d,s){
  int x,y;
  int z;
  int tmp1,tmp2;

x = a + b;
  y = c + d;
  tmp1 = x/y;
  tmp2 = x*y;

if(s==1) z=tmp1;
  else     z=tmp2;

return(z);
}
```

RT LEVEL DESCRIPTION (VHDL)

```
process (clk)
   variable State: STATE
begin
   if (State = ST0) then            - - -  STATUS 0
     R1 <= a; R2 <= b;
     State := ST1;
   elsif (State = ST1) then         - - -  STATUS 1
     R3 <= R1 + R2;
     R1 <= c; R2 <= d;
     State := ST2;
   elsif (State = ST2) then         - - -  STATUS 2
     R4 <= R1 + R2;
     State := ST3;
   elsif (State = ST3) then         - - -  STATUS 3
     R1 <= R3 * R4;
     R2 <= R3 / R4;
     R3 <= s;
     if (R3 = 1) then
          State := ST4;
     else State := ST5;
   elsif (State = ST4) then         - - -  STATUS 4
     R4 <= R1;
     State := ST6;
   elsif (State = ST5) then         - - -  STATUS 5
     R4 <= R2;
     State := ST6;
   elsif (State = ST6) then         - - -  STATUS 6
     z <= R1;
     State := ST0;
   end if;
end process;
```

4

RT LEVEL SIMULATION PROCEDURE

SWITCHING PROCEDURE FROM RT LEVEL TO ALGORITHM LEVEL

Fig. 12

VARIABLE TABLE 36, 38

| VARIABLE NAME | VARIABLE VALUE |
|---|---|
| a | 10 |
| ------- | ------- |
| z | 5 |

Fig. 13

REGISTER TABLE 39

| REGISTER NAME | REGISTER VALUE |
|---|---|
| $R_1$ | 4 |
| ------- | ------- |
| $R_4$ | 9 |

Fig. 14

REGISTER VARIABLE MAP TABLE

|  | R1 | R2 | R3 | R4 |
|---|---|---|---|---|
| STATE 0 | – | – | – | – |
| STATE 1 | a | b | – | – |
| STATE 2 | c | d | x | – |
| STATE 3 | – | – | – | y |
| STATE 4 | tem1 | tem2 | s | – |
| STATE 5 | – | – | – | z |
| STATE 6 | – | – | – | z |

Sn (pointing to STATE 3 row)

STATE TRANSITION DIAGRAM

STATE POSITION

LOGIC SIMULATION METHOD IN WHICH SIMULATION IS DYNAMICALLY SWITCHABLE BETWEEN MODELS

BACKGROUND OF THE INVENTION

1. Field of the Invention

The present invention relates to a logic simulation method and a system for the same, and more particularly, to a logic simulation method in which higher and lower level simulations can be switched on the way of simulation and a system for the same.

2. Description of the Related Art

A large-scale semiconductor integrated circuit is designed by an automatic designing apparatus. In a design procedure flow of the automatic designing apparatus, the highest level description is compiled into a lower level description. The highest level description describes a desired operation flow in a general purpose program language such as the C language or a dedicated abstraction level description language. The lower level description is such as a register transfer (RT) level description and represents the operation flow using hardware resources such as registers and adders.

There is a case where system simulators have a plurality of simulation models in which abstraction levels are different, as shown in FIG. 1. In this case, an operation level system simulator 101 carries out the simulation using an operation level simulation model with a higher abstraction level. A register transfer level system simulator 102 cannot be started on the way of the simulation of the operation level system simulator 101. Similarly, the register transfer level system simulator 102 carries out the simulation using a register transfer level simulation model with a lower abstraction level. The simulation of the operation level simulation model 101 cannot be started on the way of the simulation of the register transfer level system simulator 102. In this way, the operation level system simulator 101 and the register transfer level system simulator 102 are independent from each other, and are treated as the different ones. It is impossible to switch from one of the system simulations to the other on the way of the simulation.

Generally, a higher level simulation model is used when the simulation speed is important, and a lower level simulation mode is used when precision is important. However, there is sometimes the need to analyze the operation from a time of t1 to a time of t2 especially in detail in the simulation for the function verification. When the higher level simulator with the high precision is used from a time of 0 to the time of t2 for the function verification, it takes a great time.

Mixed simulation technique is known in Japanese Laid Open Patent Application (JP-A-Heisei 5-61934) and "Parallel Logic Simulator WIZDOM" (The 57-th National Conference of Information Processing Society of Japan, 1998). In the mixed simulation technique, a plurality of simulation models with different abstraction levels are switched during the simulation. In these references, the switching is carried out between an instruction level simulation model and a hardware simulation mode. The switching is permitted based on the fact that both of the models have a common circuit structure such as a register. Therefore, when the common circuit structure does not exist in models, the above conventional references can not be applied to the models.

Also, the technique that the simulation switching between a gate circuit level and an electronic circuit level is carried out is known in Japanese Laid Open Patent Application (JP-A-Heisei 7-110826). The data transfer in this switching uses the fact that the terminals of a gate circuit and the terminals of the electronic circuit have one-to-one correspondence, and is carried out through analog-digital conversion in the circuit terminal level.

Also, Japanese Laid Open Patent Application (JP-A-Heisei 10-261002) discloses that a circuit operation is represented by a detailed definition model and a rough definition model using a circuit description form and switching is carried out between the models.

In this way, there are known the switching between the higher level mode and the lower level model which have one-to-one correspondence, and the switching between the models with different details in the same level using the common description form.

However, the structure to hold a simulation state does not have one-to-one correspondence between the highest level programming language description such as an operation level description and the lower level description such as the register transfer level description. As the result, it is not possible to carry out the data transfer between the different level descriptions. Therefore, the switching between models in the simulation is impossible conventionally.

In this way, the establishment of the switching technique between the simulation models of different levels with no one-to-one correspondence in the description is requested for the simulation in the high speed and high precision.

SUMMARY OF THE INVENTION

Therefore, an object of the present invention is to provide a logic simulation method in which simulation can be switched between higher and lower level models, and a simulation system for the same.

Another object of the present invention is to provide a logic simulation method in which simulation can be switched between higher, middle and lower level models, and a simulation system for the same.

Still another object of the present invention is to provide a recording medium storing a program for one of the above logic simulation methods.

In order to achieve an aspect of the present invention, a logic simulation method is achieved by executing one of an algorithm level simulation corresponding to an algorithm level description and a register transfer level simulation corresponding to a register transfer level description, and by switching one of the algorithm level simulation and the register transfer level simulation into the other in response to a switching instruction using a relation between states of the algorithm level description and states of the register transfer level description. The algorithm level description is associated with arithmetic and logic operations and not associated with logic circuits. The register transfer level description is associated with logic circuits.

Here, the logic simulation method may further include converting the algorithm level description into the register transfer level description.

Also, in the conversion, the algorithm level description is converted into the register transfer level description using a table of usable resources.

Also, the logic simulation method may further includes producing an algorithm level model and a register transfer level model from the algorithm level description and the register transfer level description. The algorithm level simulation and the register transfer level simulation are executed using the algorithm level model and the register transfer level model, respectively.

Also, in the execution, while the one simulation is executed, stopping the other simulation. In this case, in the switching, a variable value set in the one simulation is transferred into the other simulation. Also, in the switching, the other simulation is started in response to the transfer of the variable value set.

Also, the logic simulation method may further include relating states of the algorithm level description and states of the register transfer level description to produce the relation. In this case, for the relation, there is produced an algorithm level model, a state transition diagram indicative of states of the algorithm level simulation, a variable table and a register/variable table indicative of variables set to registers for every state from the algorithm level description. The algorithm level simulation uses the algorithm level model. Also, a register transfer level model, a register table and a variable table is produced from the register transfer level description, the register transfer level simulation using the register transfer level model. Also, a control mechanism is produced through the producing steps. The control mechanism relates states of the algorithm level description and states of the register transfer level description such that values of the variables and values of the register are exchanged in the switching by referring to the state transition diagram, the register/variable table, the algorithm level model variable table, the register transfer level register table and the register transfer level variable table.

In order to achieve another aspect of the present invention, a logic simulation method is attained by executing one of an algorithm level simulation corresponding to an algorithm level description, a register transfer level simulation corresponding to a register transfer level description and a gate level simulation corresponding to a gate level description, and by switching one of the algorithm level simulation and the register transfer level simulation into another in response to a switching instruction using a relation between states of the algorithm level description, states of the register transfer level description, and states of the gate level description. The algorithm level description is associated with arithmetic and logic operations and not associated with logic circuits. The register transfer level description and the gate level description are associated with logic circuits.

Also, the logic simulation method may further includes converting the algorithm level description into the register transfer level description, and converting the register transfer level description into the gate level description.

Also, for the conversion, the algorithm level description is converted into the register transfer level description using a table of usable resources.

Also, the logic simulation method may further includes producing an algorithm level model, a register transfer level model and a gate level model from the algorithm level description, the register transfer level description and the gate level description. The algorithm level simulation, the register transfer level simulation and the gate level simulation are executed using the algorithm level model, the register transfer level model, and the gate level model, respectively.

Also, for the execution, while the one simulation is executed, stopping the other simulations. In this case, the switching includes transferring a variable value set in the one simulation into the other simulation. Also, the other simulation is started in response to the transfer of the variable value set.

The logic simulation method may further includes relating states of the algorithm level description, states of the register transfer level description to produce the relation, and states of the gate level description. In this case, for the relation, an algorithm level model, a state transition diagram indicative of states of the algorithm level simulation, a variable table and a register/variable table indicative of variables set to registers for every state are produced from the algorithm level description, the algorithm level simulation using the algorithm level model. Also, a register transfer level model, a register table and a variable table are produced from the register transfer level description, the register transfer level simulation using the register transfer level model. Also, a gate transfer level model, a register table and a variable table are produced from the gate level description, the gate level simulation using the register transfer level model. Then, a control mechanism is produced through the producing steps. The control mechanism relates states of the algorithm level description and states of the register transfer level description such that values of the variables and values of the register are exchanged in the switching by referring to the state transition diagram, the register/variable table, the algorithm level model variable table, the register transfer level register table, the register transfer level variable table, the gate level register table and the gate level variable table.

In order to achieve still another aspect of the present invention, a recording medium storing a program for a logic simulation method which comprises:

executing one of an algorithm level simulation corresponding to an algorithm level description and a register transfer level simulation corresponding to a register transfer level description, the algorithm level description being associated with arithmetic and logic operations and not associated with logic circuits, and the register transfer level description being associated with logic circuits; and switching one of the algorithm level simulation and the register transfer level simulation into the other in response to a switching instruction using a relation between states of the algorithm level description and states of the register transfer level description.

In order to achieve yet still another aspect of the present invention, a recording medium storing a program for a logic simulation method which comprises:

executing one of an algorithm level simulation corresponding to an algorithm level description, a register transfer level simulation corresponding to a register transfer level description and a gate level simulation corresponding to a gate level description, the algorithm level description being associated with arithmetic and logic operations and not associated with logic circuits, and the register transfer level description and the gate level description being associated with logic circuits; and switching one of the algorithm level simulation and the register transfer level simulation into another in response to a switching instruction using a relation between states of the algorithm level description, states of the register transfer level description, and states of the gate level description.

Also, another aspect of the present invention is accomplished by a logic simulation system includes: a table of usable resources; a function synthesizing section producing an algorithm level model, using the table of usable resources; first compiling means for producing a state transition diagram indicative of states of the algorithm level simulation and a variable table and a register/variable table indicative of variables set to registers for every state from the algorithm level description, the algorithm level description being associated with arithmetic and logic operations and not associated with logic circuits; second compiling means for producing a register transfer level model, and a register table from the register transfer level description, the register transfer level description being associated with logic circuits; and a control mechanism producing tool producing a control mechanism, such that the control mechanism executes one of an algorithm level simulation of the algorithm level model and a register transfer level simulation of a register transfer level model, and switches one of the algorithm level simulation and the register transfer level simulation into the other in response to a switching instruction using the state transition diagram, the register/variable table, and the register transfer level register table. In this case, the logic simulation system may further includes a logic synthesis tool producing a gate level description from the register transfer level description; and third compiling means for producing a gate level model, and a register table from the gate level description, the gate level description being associated with logic circuits. The simulation control mechanism executes one of an algorithm level simulation of the algorithm level model, a register transfer level simulation of the register transfer level model and a gate level simulation of the gate level model, and switches one of the algorithm level simulation, the register transfer level simulation and the gate level simulation into another in response to the switching instruction using the state transition diagram, the register/variable table, the register transfer level register table, and the gate level register table.

BRIEF DESCRIPTION OF THE DRAWINGS

FIG. 4 is a logic expression showing a program in an algorithm level description;

FIG. 6 is a logic expression showing a program in a register transfer level description;

FIG. 12 is a diagram showing a variable table in the logic simulation system according to the embodiment of the present invention;

FIG. 13 is a diagram showing a register table in the logic simulation system according to the embodiment of the present invention;

FIG. 14 is a diagram showing the table in the logic simulation system according to the embodiment of the present invention;

DESCRIPTION OF THE PREFERRED EMBODIMENTS

A logic simulation system of the present invention will be described below in detail with reference to the attached drawings.

Figure 1:
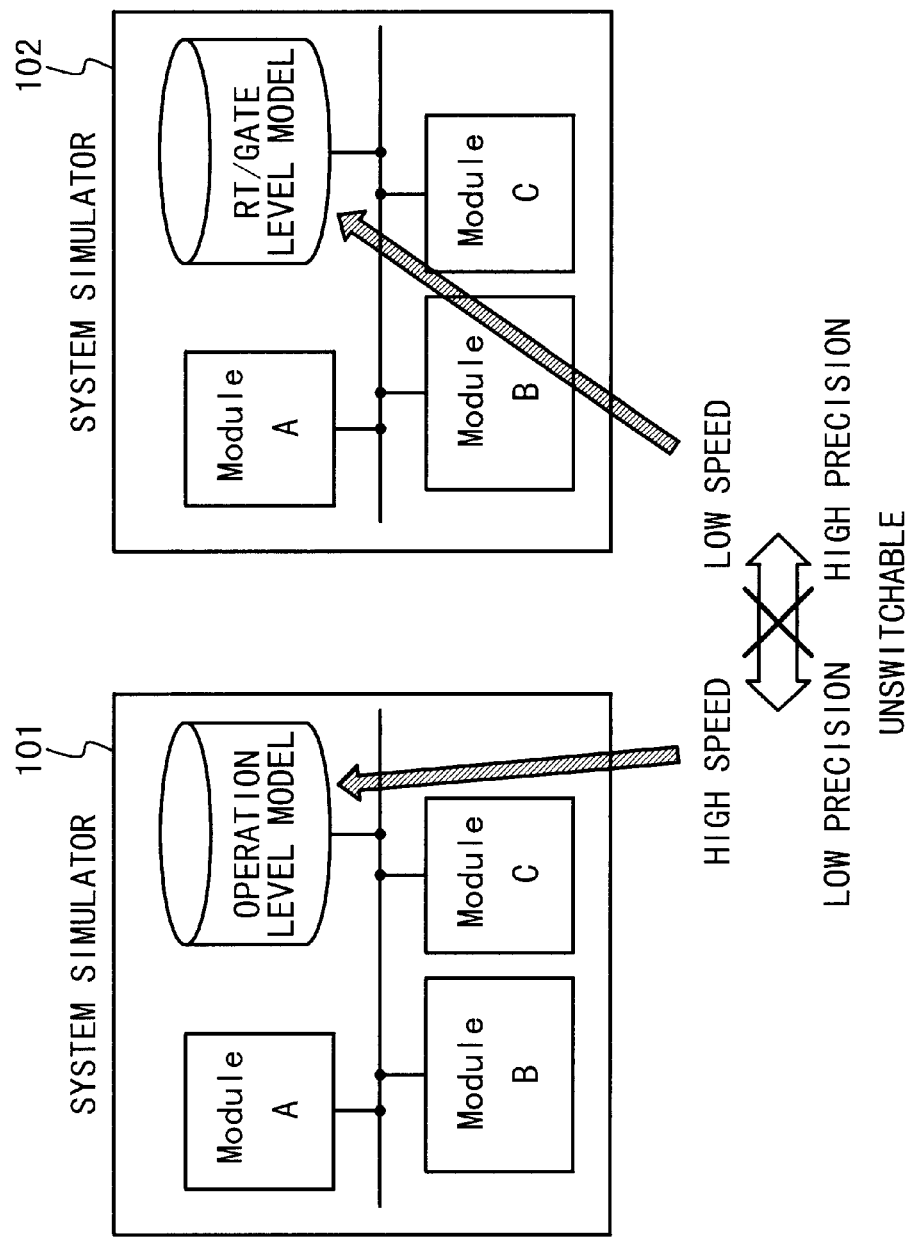
FIG. 1 is a diagram showing a conventional simulator.
Figure 2:
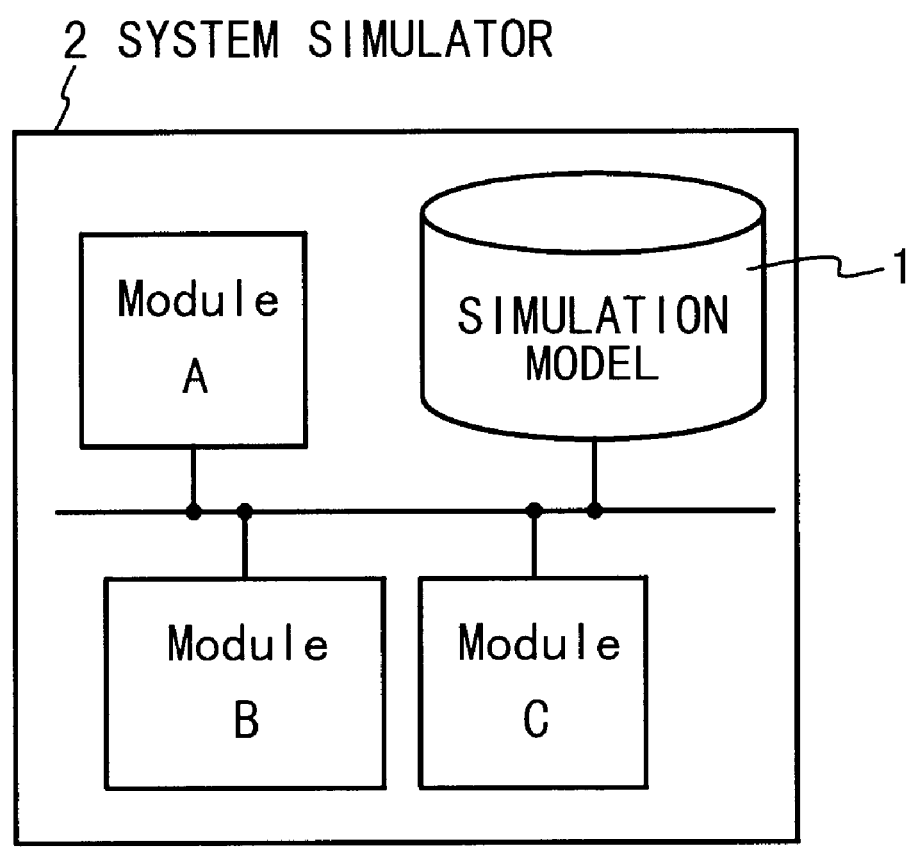
FIG. 2 is a diagram showing the structure of a logic simulation system according to an embodiment of the present invention.

FIG. 2 is a block diagram of the logic simulation system according to the embodiment of the present invention. Referring to FIG. 2, the logic simulation system in the embodiment of the present invention is composed of a system simulator 2 as an automatic design apparatus. The system simulator 2 is composed of a single simulation model 1, and modules A, B and C for models produced from the signal model 1. The single simulation model 1 means that the models in a plurality of layers produced from the simulation mode 1 are in the subordination relation to each other such that the models can share data for every state. Here, the data are a variable value set of a function when the calculation such as multiplication and addition is mainly carried out. The variable value set contains parameters which changes every state.

Figure 3:
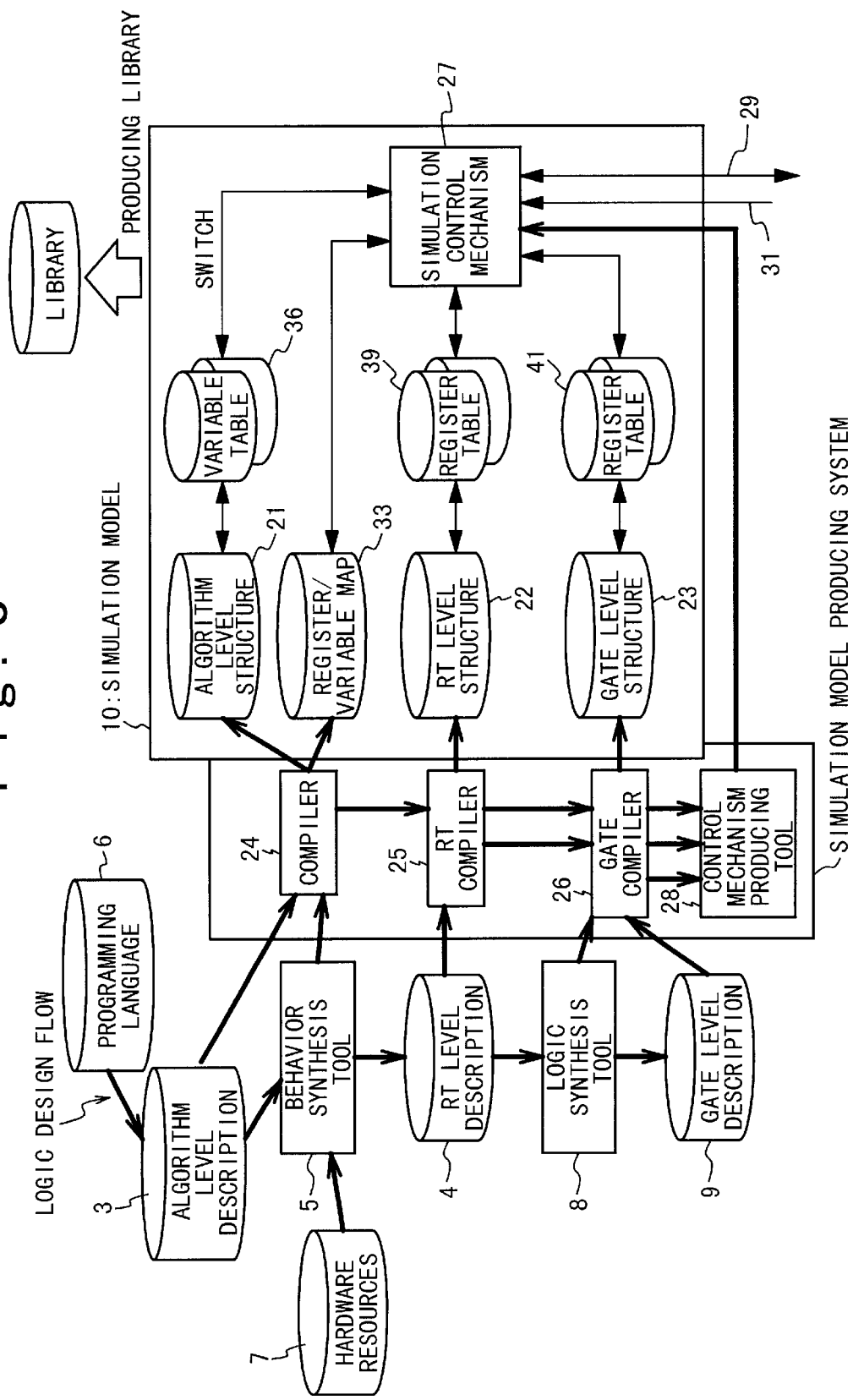
FIG. 3 is a functional block diagram showing the logic simulation system according to the embodiment of the present invention.

FIG. 3 shows a logic design flow in the logic simulation system. The automatic design apparatus including the logic simulation system automatically designs electronic circuits such as a LSI. The logic simulation system executes a program for a logic simulation method stored in a recording medium (not shown). The logic simulation system is composed of a behavior synthesis tool 5, a logic synthesis tool 8, a hardware resource table 7, a simulation model producing system and a simulation model section 10. The simulation mode producing system is composed of a compiler 24, a register transfer (RT) compiler 25, a gate compiler 26 and a control mechanism producing tool 28. The simulation model section 10 is composed of an algorithm level structure model 21, a register/variable map 33, a register transfer level structure model 22, a gate level structure model 23, a variable tables 36, register tables 39 and 41, and a simulation control mechanism 27. In logic design flow, there are an algorithm level description 3, a programming language 6, a register level description 4, and a gate level description 9.

The logic design flow starts by describing the operation of a circuit in a programming language such as the C language 6 or a dedicated algorithm level description language to produce an algorithm level description 3. The algorithm level description is a description with the highest abstraction level. FIG. 4 shows an example of the algorithm level description 3 when the C language is used. As seen from FIG. 4, the algorithm level description does not include the definition of hardware such as a register and an adder.

The algorithm level description 3 is converted into a middle level or register transfer (RT) level description 4 which is closer to the hardware level description than the algorithm level description 3. At this time, a behavior synthesis tool 5 is used as an implementation tool for the conversion. The behavior synthesis tool 5 is supplied with the algorithm level description 3 shown in FIG. 4 and a table of hardware resources 7 shown in FIG. 5. In this example, the table of hardware resources 7 is formed from four registers Rn (n=1 to 4), one adder 12, one multiplier 13, one divider 14, and one multiplexer 15. The behavior synthesis tool 5 is set with the clock period of the circuit and the table of hardware resources 7 as hardware constraint, and then is supplied with the algorithm level description 3. The behavior synthesis tool 5 produces a state transition data and a control data flow graph (CDFG). The state transition data is necessary to compile the algorithm level description 3 into the register transfer level description 4. The control data flow graph is necessary for the scheduling to allocate variables to the registers in the register transfer level description 4. Thus, the behavior synthesis tool 5 outputs the register transfer level description 4 as shown in FIG. 6. In the allocation of registers, the registers can take different variable values depending on the time. In this way, the program variables which are represented in the algorithm level description 3 are allocated to register transfer level description 4. Also, the register transfer level description 4 is complied into a further lower gate level description 9 by use of the logic synthesis tool 8 as shown in FIG. 3.

Figure 7:
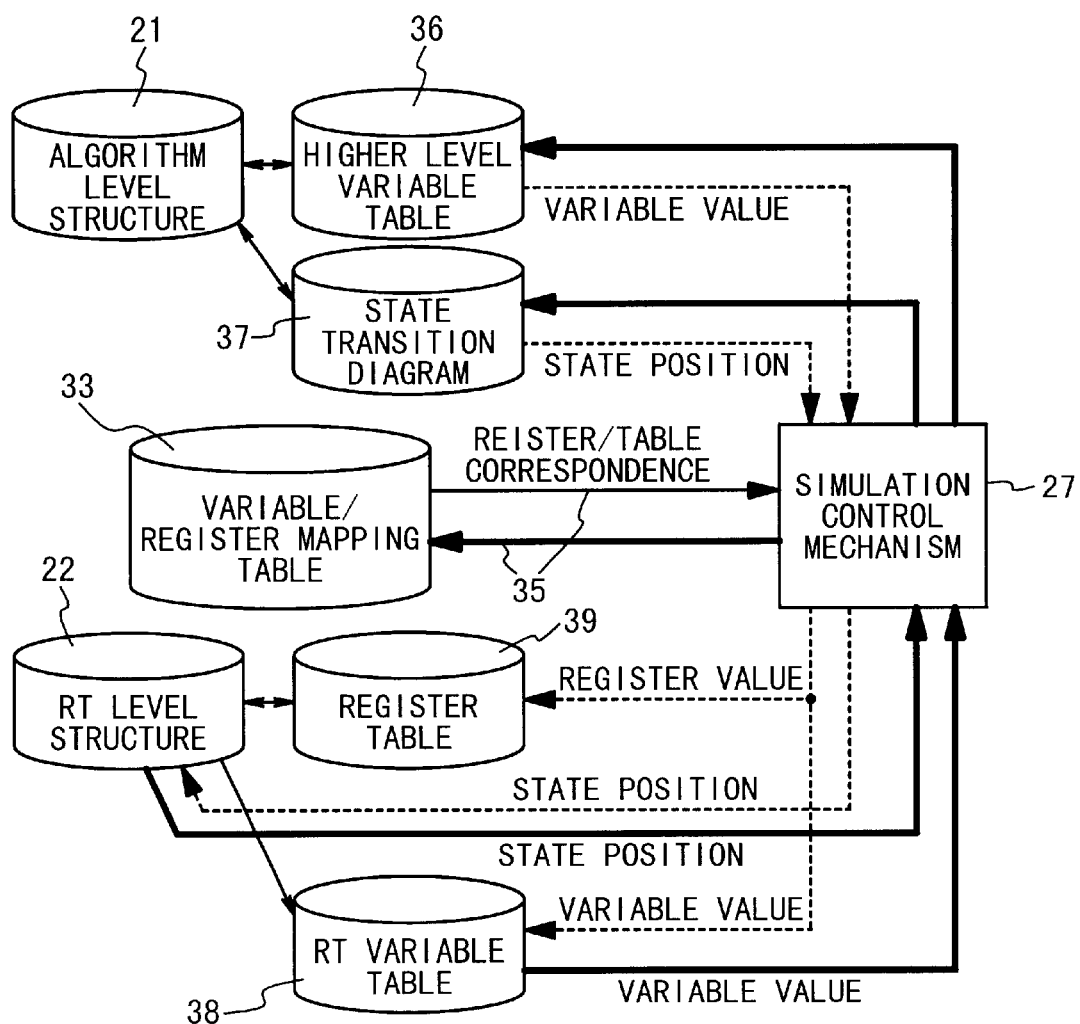
FIG. 7 is a function block diagram showing a part of FIG. 3 in detail.

The simulation model section 10 contains three simulation models, i.e., an algorithm level structure model 21, a register transfer level structure model 22, and a gate level structure model 23. The algorithm level structure model 21 is produced from the algorithm level description 3 by the compiler 24. At this time, the compiler 24 also produces a higher level variable table 36, a state transition diagram 37, a variable/register mapping table 33, a register transfer variable table 38, and a gate level variable table (not shown), as shown in FIG. 7. The register transfer level structure model 22 is produced from the register transfer level description 4 by the register transfer compiler 25. At this time, the register transfer compiler 25 also produces the register table 39. The gate level structure model 23 is produced from the gate level description 9 by the gate compiler 26. At this time, the gate compiler 26 also produces the register table 41. These simulation structure models 21, 22 and 23 can be produced by use of a well known programming language compiler or the compiler technique such as an HDL simulator.

The simulation model section 10 contains the simulation control mechanism 27. The control mechanism producing tool 28 obtains the data indicating structure models from the compilers 24, 25 and 26 and produces the simulation control mechanism 27. The simulation control mechanism 27 outputs a simulation result outside as a signal 29. Also, the simulation control mechanism 27 is supplied with an abstraction level selecting signal 31 from the user to select one of the simulation abstraction levels. The simulation is carried out in accordance with the selected simulation abstraction level.

In FIG. 3, thick arrow lines show a flow at the time of the model production and thin arrow lines show a flow at the time of the simulation to be mentioned later. The flow at the time of the simulation is shown in FIG. 7 in detail. In FIG. 7, the gate level structure model 23 is omitted.

The variable/register mapping table 33 holds a higher level correspondence between a higher level model transition state HSn of the algorithm level structure model 21 and the variable value set HV in the higher level model transition state HSn. The higher level model transition state HSn indicates a simulation step as a transition position in the simulation of the algorithm level structure model 21. Moreover, the variable/register mapping table 33 holds a lower level correspondence between the lower level model transition state LSn of the register transfer level structure model 22 and the variable value set LV in the lower level model transition state LSn. The lower level model transition state LSn indicates a simulation step as a transition position in the simulation of the register transfer level structure model 22.

The state position n of the higher level model transition state HSn and the state position n of the lower level model transition state LSn, and the variable value set HV in the higher level model transition state HSn and the variable value set LV in the lower level model transition state LSn are held in the variable/register mapping table 33 to have the same value set at the same time. As a result, the state positions and the variable value sets can be shared by the algorithm level structure model 21 and the register transfer level structure model 22. Also, the state positions and the variable value sets are held based on the control of the simulation control mechanism 27 such that the state positions and the variable value sets can be reproduced from one to the other. Otherwise, it may be controlled to take correspondence between the higher level side variable value set and the lower level side variable value set, when the switching of the simulation is carried out. The state position of the lower level model transition state LSn and the state position of the higher level model transition state HSn are expressed as Sn in the following description in common. The variable value set HV corresponding to the higher level model transition state HSn and the variable value set LV corresponding to the lower level model transition state LSn are expressed as V in the following description in common.

The Variable value set V corresponds to the register Rn. The correspondence of the variable value set V and the register Rn is referred to as a register/variable correspondence. The variable/register mapping table 33 is provided to hold the register/variable correspondence in correspondence to the state position Sn. A register/variable correspondence signal 35 is exchanged between the variable/register mapping table 33 and the simulation control mechanism 27.

In FIG. 7, the higher level variable table 36 and the state transition diagram 37 are interposed between the algorithm level structure model 21 and the simulation control mechanism 27. This notation may be replaced by the notation that the algorithm level structure model 21 contains the higher level variable table 36 and the state transition diagram 37. The higher level variable table 36 is produced by the compiler 24 using the behavior synthesis tool 5, and stores the variable value set of the algorithm level structure model 21 at the time of the algorithm level simulation. The state transition diagram 37 is produced by the compiler 24 using the behavior synthesis tool 5 and always grasps the state position Sn at the time of the algorithm level simulation.

The lower level or register transfer level variable table 38 and the register table 39 are interposed between the register transfer level structure model 22 and the simulation control mechanism 27. The lower level variable table 38 is produced by the compiler 24 using the behavior synthesis tool 5 and stores the variable value set of the registers of the register transfer level structure model 22 at the time of the register transfer level simulation. That is, the lower level variable table 38 stores the variable value set equivalent to the variable value set of the algorithm level structure model 21 which is obtained from the variable/register mapping table 33. The register table 39 stores the register value sets of register transfer level structure model 22 at the time of the register transfer level simulation.

The simulation control mechanism 27 transfers the variable value set V of the higher level variable table 36 to the lower level variable table 38 and the register transfer level structure model 22. Also, the simulation control mechanism 27 transfers the variable value set V to the register table 39 as a register correspondence value set. The simulation control mechanism 27 transfers the state position Sn of the state transition diagram 37 to the lower level variable table 38 and the register transfer level structure model 22. The simulation control mechanism 27 transfers the state position Sn of the register transfer level structure model 22 to the state transition diagram 37.

The simulation control mechanism 27 transfers a pair of the variable value set V of the higher level variable table 36 and the state position Sn of the state transition diagram 37 to the variable/register mapping table 33 to be held therein. The simulation control mechanism 27 transfers a pair of the state position Sn of the register transfer level structure model 22 and the variable value set V of the lower level variable table 38 to the variable/register mapping table 33 to be held therein. In FIG. 7, thin dotted arrow lines show a data flow in the switching operation from the algorithm level simulation to the register transfer level simulation and thick solid arrow lines show a data flow in the switching operation from the register transfer level simulation to the algorithm level simulation.

Figure 8:
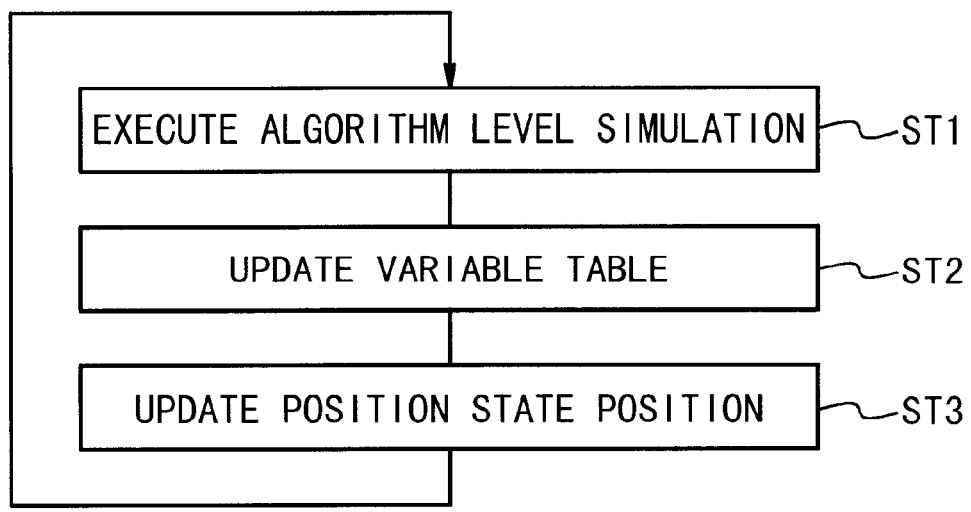
FIG. 8 is a flow chart showing a logic simulation system according to the embodiment of the present invention.

FIG. 8 shows an algorithm level simulation procedure. When the algorithm level simulation is selected by the user by use of the abstraction level selecting signal 31, the algorithm level simulation is executed (Step ST1). The variable value set V of each of the state positions in the algorithm level simulation is updated on the higher level variable table 36 (step ST2), and subsequently, the state position Sn corresponding to the variable value set V is updated on the state transition diagram 37 (Step ST3). Such updating operations are repeated during the execution of the algorithm level simulation.

Figure 9:
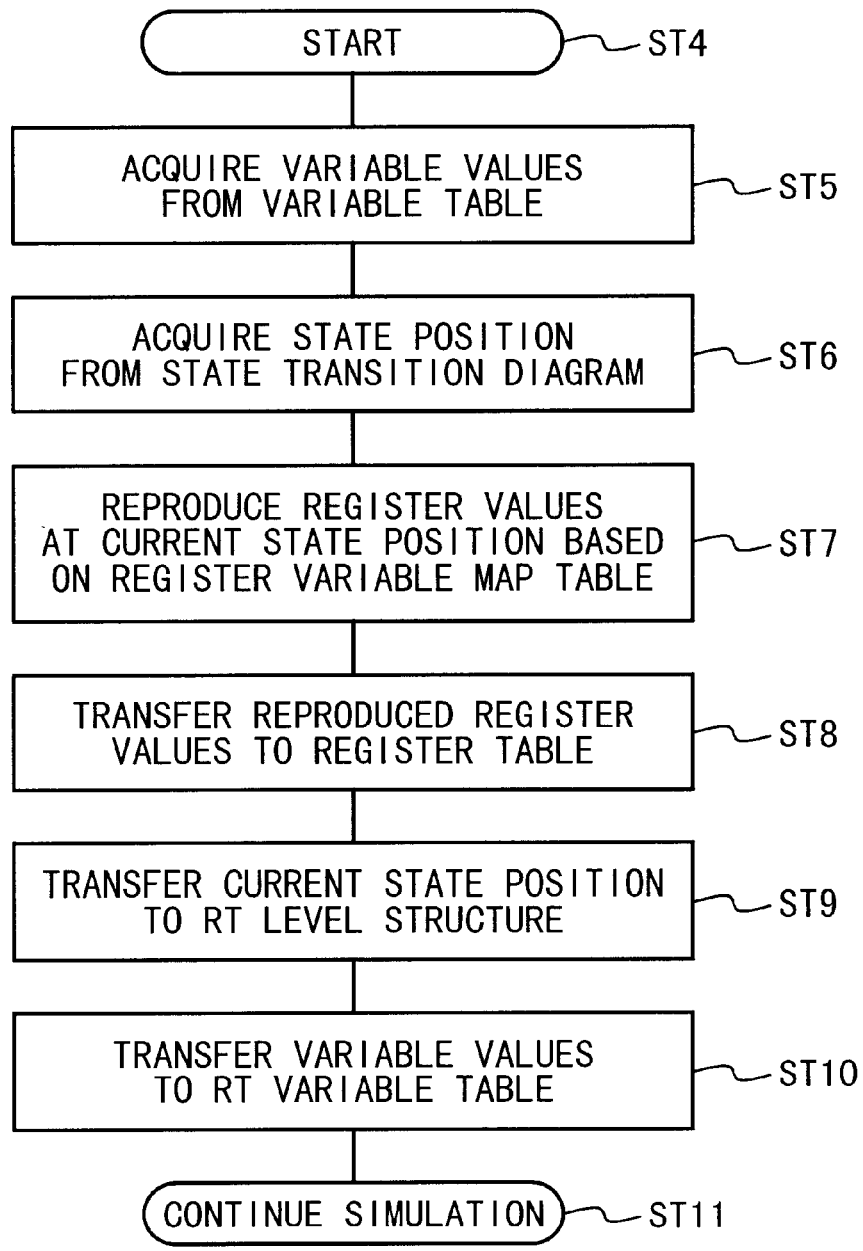
FIG. 9 is a flow chart showing the logic simulation system according to the embodiment of the present invention.

FIG. 9 shows the switching procedure from the algorithm level simulation to the register transfer level simulation. The abstraction level selecting signal 31 is inputted to the simulation control mechanism 27 by the user and then the switching operation is started (Step ST4). The simulation control mechanism 27 acquires the variable value set V from the higher level variable table 36 and stores in the variable/register mapping table 33 (step ST5). Also, the simulation control mechanism 27 acquires the state position Sn from the state transition diagram 37 and transfers to the variable/register mapping table 33 (Step ST6).

The simulation control mechanism 27 refers to the variable/register mapping table 33 based on the state position Sn to reproduce the register value set in the current state position (Step ST7). The simulation control mechanism 27 transfers the register value set reproduced in this way to the register table 39 (Step ST8). Also, the simulation control mechanism 27 transfers the current state position Sn to the register transfer level structure model 22 (Step ST9). Also, the simulation control mechanism 27 transfers the variable value set V of the higher level variable table 36 to the lower level variable table 38 (Step ST10).

In this way, the register transfer level structure model 22 acquires the register value set corresponding to the variable value set in the state position of the algorithm level structure model 21. The acquired register value set are set or in the registers. This data acquisition is a condition for the start of the register transfer level simulation. Thus, the register transfer level simulation inherits the data which are obtained in the algorithm level simulation, and the simulation is continued (Step ST11). The variable/register mapping table 33 is provided to hand over such data. There is substantially no delay of the simulation due to the operation of the variable/register mapping table 33.

Figure 10:
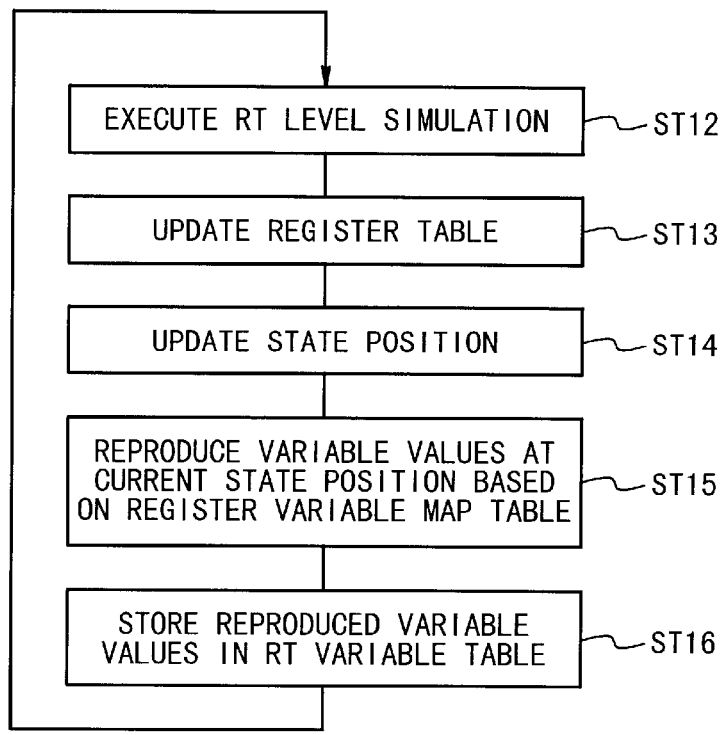
FIG. 10 is a flow chart showing the logic simulation system according to the embodiment of the present invention.

FIG. 10 shows a register transfer level simulation procedure. The simulation is already switched from the algorithm level simulation to the register transfer level simulation. Thus, the register transfer level simulation is executed (Step ST12).

The register value set in each of the states of the register transfer level simulation is updated on the register table 39 (Step ST13). Subsequently, the state position Sn is updated on the correspondence unit 33 (Step ST14). The variable value set V in the current state position is reproduced on the variable/register mapping table 33 (Step ST15). The variable value set V reproduced in this way is stored in the register table 39 (Step ST16). The steps ST12 to ST16 are repeated each time the transition of the state.

Figure 11:
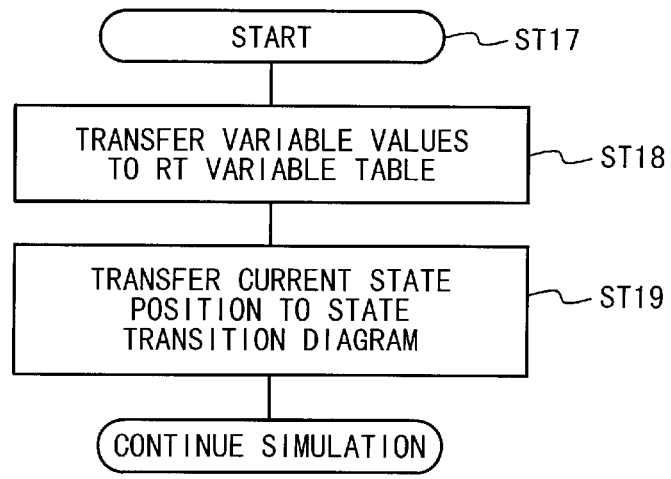
FIG. 11 is a flow chart showing the logic simulation system according to the embodiment of the present invention.

FIG. 11 shows a method of switching from the register transfer level simulation to the algorithm level simulation. The abstraction level selecting signal 31 is inputted to the simulation control mechanism 27 by the user, and the switching operation is started (Step ST17).

The variable value set V of the lower level variable table 38 is transferred to the higher level variable table 36 (Step ST18). The current state position Sn of the register transfer level structure model 22 is transferred to the state transition diagram 37 (Step ST19). Thus, the simulation is continued as the algorithm level simulation. The exchange or reproduction of these data is carried out through the variable/register mapping table 33 in the same manner as the above mentioned switching operation from the algorithm level simulation to the register transfer level simulation.

A specific operation in the above mentioned system will be described below using the algorithm level description 3 shown in FIG. 4. The algorithm level description 3 is shown as the following specific example and is described in the C language.

$$x = a + b;$$
$$y = c + d;$$
$$tmp1 = x / y;$$
$$tmp2 = x * y$$

If s is 1, z=tmp1=(a+b)/(c+d);
If s is not 1, z=tmp2=(a+b)(c+d)

Figure 5:
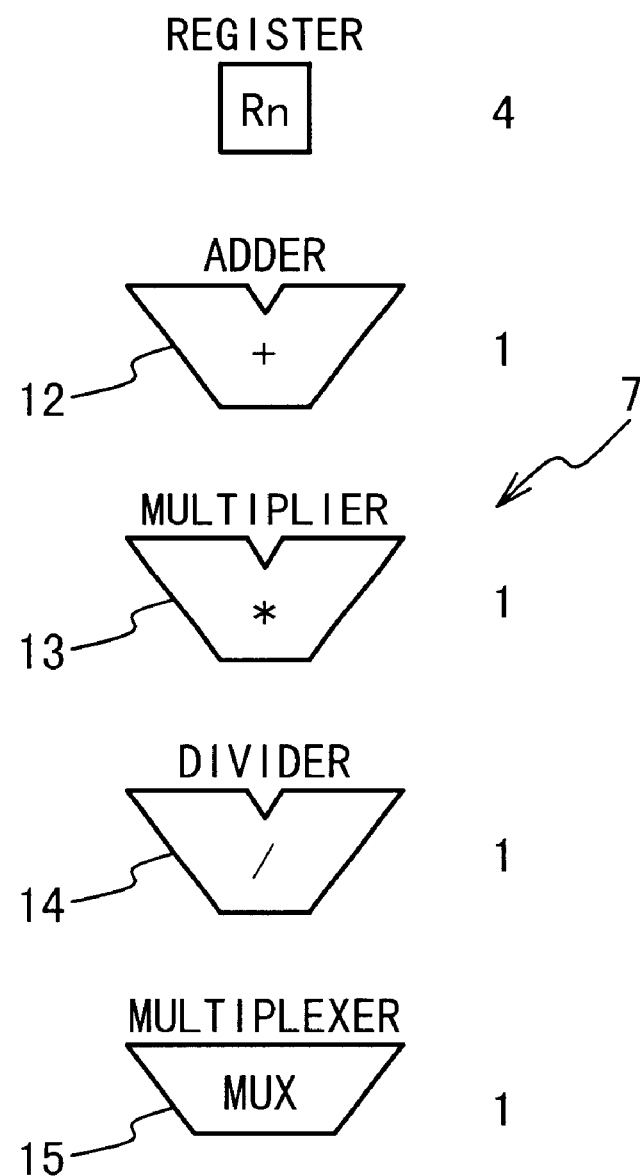
FIG. 5 is a diagram showing a table of hardware resources.
Figure 15:
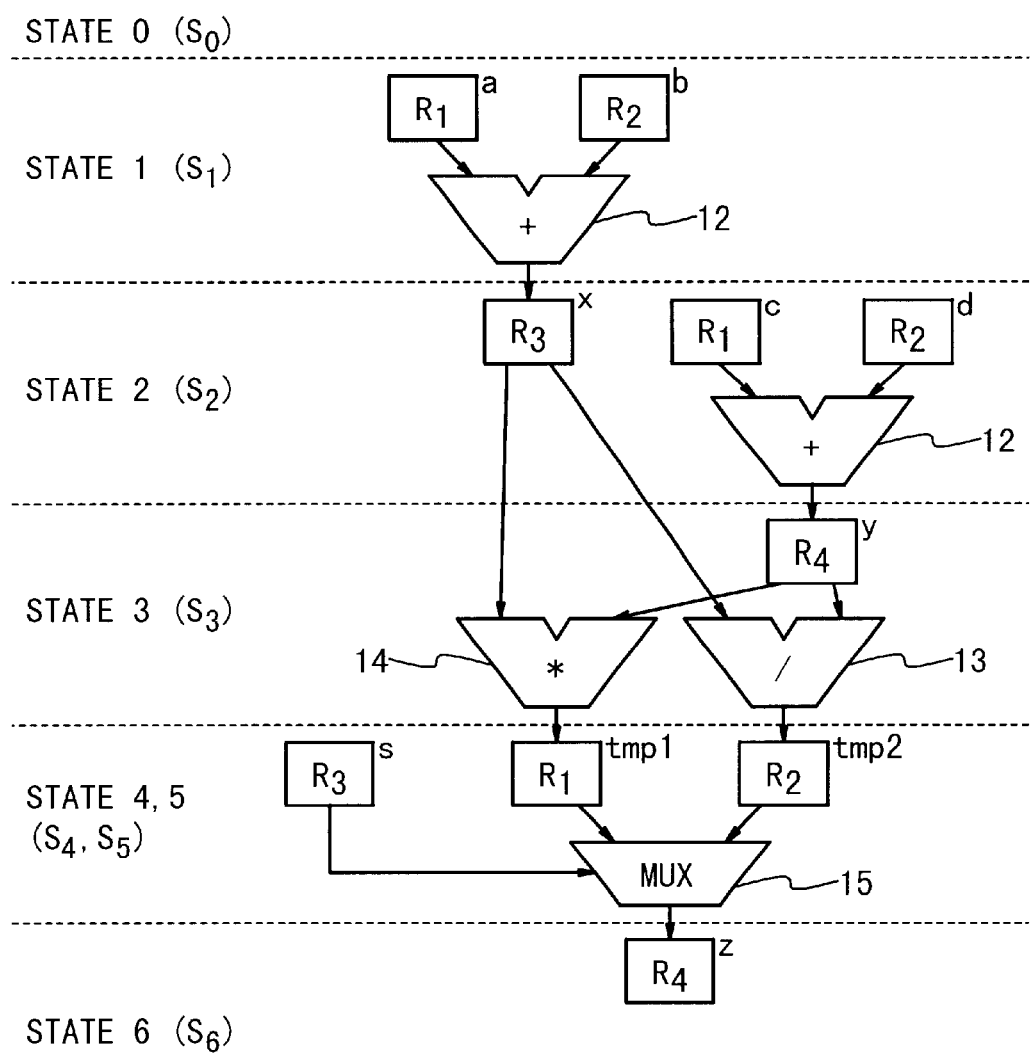
FIG. 15 is a transition diagram (CDFG: control data flow graph) showing logic transition in the logic simulation system according to the embodiment of the present invention.
Figure 16:
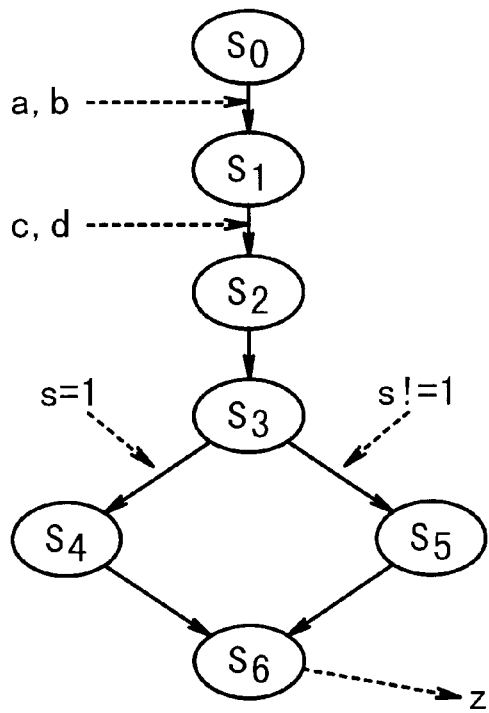
FIG. 16 is a diagram showing the state transition in the logic simulation system according to the embodiment of the present invention.

The above-mentioned algorithm level description 3 and the available hardware resource table 7 shown in FIG. 5 are supplied to the behavior synthesis tool 5. At this time, the behavior synthesis tool 5 produces the register transfer level description 4 shown in FIG. 6 in accordance with the supplied algorithm level description 3. Also, the behavior synthesis tool 5 and the compiler 24 produce the control date flow graph (CDFG) shown in FIG. 15 and the state transition diagram 37 shown in FIG. 16. FIG. 16 shows the relation of a plurality of state transitions in the algorithm level description 3 and the variable value set associated with each of the state transitions. On the other hand, FIG. 15 shows how each of the states in the above-mentioned algorithm level description 3 is allocated to the register transfer level description 4. The control data flow graph (CDFG) bridges between the algorithm level description 3 and the register transfer level description 4.

The variable/register map table 33 is produced using the state transition diagram 37 and the above mentioned control data flow graph (CDFG) which are produced by the behavior synthesis tool 5, as shown in FIG. 14. The variable/register mapping table 33 is a communication exchanger between the algorithm level simulation using the algorithm level structure model 21 and the register transfer level simulation using the register transfer level structure model 22. FIG. 12 shows the higher level variable table 36 on the higher level side and the lower level variable table 38 on the lower level side. FIG. 13 shows the register table 39 used in the register transfer level structure model 22.

As described above, FIG. 12 shows the specific examples of the higher level variable table 36 and lower level variable table 38. The variable names are generally shown as "a" to "z". However, because the variables are "a", "b", "c", "d", "s", "x", "y", "tmp1", "tmp2" and "z" as specifically shown in FIG. 4, the variables are "a" to "j". The table structure of the higher level variable table 36 is basically the same as that of the lower level variable table 38. As for the hardware resources, four registers are enough to carry out the operation shown in FIG. 4, as understood from the flow shown in FIG. 15. These four registers are shown in FIG. 5.

FIG. 13 shows the register table which shows the correspondence between the variable value set substituted into the four registers and a set of register names R1 to R4. For example, if the variable value set of the variables c and d shown in FIG. 4 are "4" and "5", the specific value of the register R1 is "4" and the specific value of register R4 is "9" (=4+5). Such values are substituted into or registered in those registers each time the state transition, and the substitution state corresponds to the state position as a step number on a time axis.

Therefore, the register value set is changed each time the transition of the state position Sn(t). At this time, the time can be expressed as a time sequence. Such a state position is shown in FIG. 14 in correspondence with the algorithm level description 3 of FIG. 4. The number of state positions due to change of the variable value set is 6 as shown in FIG. 15, including an initial state position SO. Such 6 states are shown in FIG. 14 as the data of the variable/register mapping table 33. In the matrix of the variable/register mapping table 33 shown in FIG. 14, the specific value set of the state position at that time is registered on the registers R1 to R4 in the real time. Therefore, the variable/register mapping table 33 is the matrix of 6 state positions Sn (n=1 to 6) and 4 registers Rn (n=1 to 4).

Figure 17:
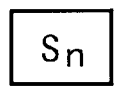
FIG. 17 is a diagram showing the holding of the state position in the logic simulation system according to the embodiment of the present invention.

FIGS. 15 and 16 show the control data flow graph and the state transition diagram 37 as mentioned above. In the state position S0, no variable value set V appears. The data flow structure expressed in FIGS. 15 and 16 is produced by the behavior synthesis tool 5 and the compiler 24, and this flow structure is used for the production of a simulation model. FIG. 17 shows that the state position is held in the flow and during the transition as the number of positions.

In the state position S1, the addition of the held variable of "a" and the held variable of "b" is carried out by an adder 12. These variables of "a" and "b" are substituted into the registers R1 and R2. This state position S1 corresponds to the state 1 in the register transfer level description 4 shown in FIG. 6.

When the simulation mode is switched in this state, the mapping of the variable value set of "a" and "b" and the state position S1 is carried out in the variable/register mapping table 33. Then, the register value set of "a" and "b" is reproduced through the mapping and is transferred to the register table 39. Also, the variable value set of "a" and "b" is transferred to the lower level variable table 38. The register value set of "a" and "b" is substituted into the registers R1 and R2 in the state 1 of the register transfer level description 4. The simulation of the register transfer level description 4 is started through this substitution, and the state is switched to the state 2. In the state 2, the addition value set of (a+b) is substituted into the register R3. Thereafter, the register transfer level simulation can be continued.

The following addition (y=c+d) in the simulation of the algorithm level description 3 is executed. Supposing that the simulation mode is switched here, the variable value set of "c" and "d" is substituted into the registers R1 and R2 in the state 2 of the register transfer level description 4. Also, the addition value set of (c+d) is substituted into the register R4 in the state 2. The multiplication and division (xy, x/y) as the following calculations in the simulation of algorithm level description 3 are executed. Supposing that the simulation mode is switched, the variable value set of "x" and "y" is substituted into the registers R3 and R4 in the state 3 of the register transfer level description 4. The multiplication value set and the division value set are substituted into the registers R1 and R2. Thus, the register transfer level simulation is continued.

It is supposed that the following logic calculation in the simulation of the algorithm level description 3 is executed and then the simulation model is switched here. The register values of the registers R1 and R2 are substituted into the register R4 in the states 4 and 5 of the register transfer level description 4. The variable "s" is determined in the algorithm level description 3 and then the final variable value set of "z" in the algorithm level description 3 is calculated. Supposing that the simulation model is switched here, the multiplication value set as the register value set of the selected register R1 is substituted into the variable value set of "z" in the state 6 of the register transfer level description 4. Thus, the register transfer level simulation completes. By tracing in an opposite direction, the variable value set of the algorithm level description 3 can be found from the register value set and the state position and the simulation of the algorithm level description 3 can be carried out.

Seeing the algorithm level description 3 of FIG. 4 and the register transfer level description 4 of FIG. 6 in the viewpoint of only the description, there is no the connectivity between the algorithm level description 3 and the register transfer level description 4. In other words, any circuit element is described in the algorithm level description 3. The register transfer level description 4 is associated with circuit elements such as a register and an adder. Therefore, the algorithm level description 3 and the register transfer level description 4 are completely independent from each other. Thus, the switching operation cannot be generally carried out between both of the descriptions. The correspondence relation between the variable value set in the algorithm level description 3 and the register value set in the register transfer level description 4 via the state position allows the mutual switching operation between the algorithm level description 3 and the register transfer level description 4.

It is supposed that the following value set is given for the variables of FIG. 4:

a=2, b=3, c=4, and d=5

When the switching of the simulation is caused in the state position S2, in which y=c+d is calculated, of the algorithm level description 3 of FIG. 4, the transition stops there in the algorithm level description 3. In this state S2, x=5, c=4 and d=5. As shown in FIG. 15, in this state position, R3=x=5, R1=c=4 and R2=d=5. The correspondence of the state position S2 and the register value set in the state position S2 is produced as shown in FIG. 14.

In the variable/register mapping table 33 shown in FIG. 14, the specific values of "4", "5" and "5" are set as 3 variables of "x", "c" and "d" in the state 2. The register values of the registers R1, R2 and R3 are "5", "5" and "4". The register transfer level description 4 shown in FIG. 6 is produced to fully correspond to the control data flow graph shown in FIG. 15. However, because the simulation is stopped, the values of the registers R1 and R2 in the state 1 of FIG. 6 are not known. Also, the value of the register R3 in the state 2 of FIG. 6 is not known. The already known values of "4", "5" and "5"in the state 2 of the table of the FIG. 14 are substituted into the registers R1, R2 and R3 in the state 2 of the register transfer level description shown in the FIG. 6 in accordance with the above mentioned control data flow graph. Thus, the simulation is re-started.

It is the operation start condition of the logic simulation system that such a variable value set is determined. The specific values of "4", "5" and "5" determined in this way are substituted into the registers R1, R2 and R3 of the register transfer level description 4 in the state 2. In this case, the operation start condition is satisfied so that the register transfer level simulation in the state 2 of FIG. 6 is started. At that time, if there is not any instruction to switch the simulation model again, the simulation is continuously carried out from the state 3 to the state 6. The description of the switching operation in an opposite direction is omitted, because it could be easily understood from the above description.

It is possible to apply the above mentioned variable/register mapping table 33 to the gate level structure model 23 in the logic simulation system. As mentioned above, in the logic simulation system, the paths of the data conversion are formed based on the bidirectional relation between the higher level variables, the state transition diagram 37, and the variable/register mapping table 33, and the bidirectional relation between the variable/register mapping table 33 and the register transfer level register table 39. On the other hand, the register transfer level register table 38 and the gate level register table 41 have one-to-one correspond between these descriptions as shown in FIG. 3. Therefore, as understood from the above description, the simulation switching can be carried out between the register transfer level simulation and the gate level simulation. Thus, it becomes possible to switch between the algorithm level simulation and the gate level simulation through the variable/register mapping table 33. That is, as shown in FIG. 3, a circuit description in each state is automatically generated in the flow of the algorithm level description 3→behavior synthesis tool 5→register transfer level description 4→logic synthesis tool 8→gate level description 9. Then, these descriptions are inputted to the corresponding compilers 24, 25 and 26. Thus, the simulation model structures 21 to 23 can be obtained. In this case, if the gate level register table 41 and a gate level variable table are produced between the algorithm level structure mode 21 and the gate level structure model 23, and the variable/register mapping table 33 is produced to make the gate level register table 41 and a gate level variable table correspond to the variable table 36 and the state transition diagram, the algorithm level structure mode 21 and the gate level structure model 23 have one-to-one correspondence. Therefore, it is possible to switch between the algorithm level simulation and the gate level simulation. Such a switching operation can be carried out in response to the abstract level selecting signal 31 inputted to the simulation control mechanism 27.

In this way, because the algorithm level simulation and the gate level simulation can be switched, the gate level simulation is possible to be carried out in the very large system. Through the gate level simulation, the timing verification in the gate level is made possible in consideration of the whole operation. Thus, the defect of the circuit can be detected in an early step of the design at high speed.

According to the present invention, in the logic simulation system, the connection between the variables can be accomplished in the state position between of the higher and lower level descriptions which are different from each other in the abstraction level and which do not have any causality between the description at all. Therefore, it is possible to switch between higher and lower level simulations in an optional state position.

Also, according to the present invention, the simulation switching is possible in order in all the hierarchical layers. Through such switching, the optimal estimation of the use resources can be carried out at the high speed when the algorithm level description is written down into a hardware level description.

Moreover, the detailed function verification can be carried out to a semiconductor integrated circuit with a very large system level.

Also, generally, an optimization function of the object program production is provided with a compiler for a general purpose program language. The improvement of this optimization function is faster than the improvement of the register transfer level language and the gate level language. Therefore, because it is possible to carry out the algorithm level simulation at a very high speed using this optimization function, linkage of the algorithm level simulation and the lower level simulation allows the function verification to be carried out at a very high speed at the system level.

What is claimed is:

1. A logic simulation method comprising:

executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits; and switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously.

2. A logic simulation method comprising:

executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits; and switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously, further comprising:

converting said algorithm level description into said register transfer level description.

3. A logic simulation method comprising:
executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits; and
switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously, wherein said converting includes:
converting said algorithm level description into said register transfer level description using a table of usable resources.

4. A logic simulation method comprising:
executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits; and
switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously, further comprising:
producing an algorithm level model and a register transfer level model from said algorithm level description and said register transfer level description, and
wherein said algorithm level simulation and said register transfer level simulation are executed using said algorithm level model and said register transfer level model, respectively.

5. A logic simulation method according to claim 1, wherein said executing includes:
while said one simulation is executed, stopping said other simulation.

6. A logic simulation method according to claim 5, wherein said switching includes:
transferring a variable value set in said one simulation into said other simulation.

7. A logic simulation method according to claim 6, wherein said switching includes:
starting said other simulation in response to said transfer of said variable value set.

8. A logic simulation method according to claim 1, further comprising:
relating states of said algorithm level description and states of said register transfer level description to produce said relation.

9. A logic simulation method comprising:
executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits;
switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously; and
relating states of said algorithm level description and states of said register transfer level description to produce said relation, wherein said relating includes:
producing an algorithm level model, a state transition diagram indicative of states of said algorithm level simulation, a variable table and a register/variable table indicative of variables set to registers for every state from said algorithm level description, said algorithm level simulation using said algorithm level model;
producing a register transfer level model, a register table and a variable table from said register transfer level description, said register transfer level simulation using said register transfer level model; and
producing a control mechanism through said producing steps, wherein said control mechanism relates states of said algorithm level description and states of said register transfer level description such that values of said variables and values of said register are exchanged in said switching by referring to said state transition diagram, said register/variable table, said algorithm level model variable table, said register transfer level register table and said register transfer level variable table.

10. A logic simulation method comprising:
executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits; and
switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said register transfer level description having a same value set simultaneously.

11. A logic simulation method comprising:

executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits; and switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said register transfer level description having a same value set simultaneously, and further comprising:

converting said algorithm level description into said register transfer level description; and converting said register transfer level description into said gate level description.

12. A logic simulation method comprising:

executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits; and switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said resister transfer level description having a same value set simultaneously, wherein said converting includes:

converting said algorithm level description into said register transfer level description using a table of usable resources.

13. A logic simulation method comprising:

executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits; and switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said register transfer level description having a same value set simultaneously, and further comprising:

producing an algorithm level model, a register transfer level model and a gate level model from said algorithm level description, said register transfer level description and said gate level description, and wherein said algorithm level simulation, said register transfer level simulation and said gate level simulation are executed using said algorithm level model, said register transfer level model, and said gate level model, respectively.

14. A logic simulation method according to claim 10, wherein said executing includes:

while said one simulation is executed, stopping said other simulations.

15. A logic simulation method according to claim 14, wherein said switching includes:

transferring a variable value set in said one simulation into said other simulation.

16. A logic simulation method according to claim 15, wherein said switching includes:

starting said other simulation in response to said transfer of said variable value set.

17. A logic simulation method according to claim 10, further comprising:

relating states of said algorithm level description, states of said register transfer level description to produce said relation, and states of said gate level description.

18. A logic simulation method comprising:

executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits;

switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said register transfer level description having a same value set simultaneously; and relating states of said algorithm level description, states of said register transfer level description to produce said relation, and states of said gate level description, wherein said relating includes:

producing an algorithm level model, a state transition diagram indicative of states of said algorithm level simulation, a variable table and a register/variable table indicative of variables set to registers for every state from said algorithm level description, said algorithm level simulation using said algorithm level model;

producing a register transfer level model, a register table and a variable table from said register transfer level description, said register transfer level simulation using said register transfer level model;

producing a gate transfer level model, a register table and a variable table from said gate level description, said gate level simulation using said register transfer level model; and producing a control mechanism through said producing steps, wherein said control mechanism relates states of said algorithm level description and states of said register transfer level description such that values of said variables and values of said register are exchanged in said switching by referring to said state transition diagram, said register/variable table, said algorithm level model variable table, said register transfer level register table, said register transfer level variable table, said gate level register table and said gate level variable table.

19. A recording medium storing a program for a logic simulation method which comprises:

executing one of an algorithm level simulation corresponding to an algorithm level description and a register transfer level simulation corresponding to a register transfer level description, said algorithm level description being associated with arithmetic and logic algorithm and not associated with logic circuits, and said register transfer level description being associated with logic circuits; and switching one of said algorithm level simulation and said register transfer level simulation into the other in response to a switching instruction using a relation between states of said algorithm level description and states of said register transfer level description, said relation comprising a state position of an algorithm level model produced from said algorithm level description and a state position of a register transfer level model produced from said register transfer level description having a same value set simultaneously.

20. A recording medium according to claim 19, wherein said logic simulation method further comprises:

converting said algorithm level description into said register transfer level description.

21. A recording medium according to claim 19, wherein said converting includes:

converting said algorithm level description into said register transfer level description using a table of usable resources.

22. A recording medium according to claim 19, wherein said algorithm level simulation and said register transfer level simulation are executed using said algorithm level model and said register transfer level model, respectively.

23. A recording medium according to claim 19, wherein said executing includes:

while said one simulation is executed, stopping said other simulation.

24. A recording medium according to claim 23, wherein said switching includes:

transferring a variable value set in said one simulation into said other simulation.

25. A recording medium according to claim 24, wherein said switching includes:

starting said other simulation in response to said transfer of said variable value set.

26. A recording medium according to claim 19, wherein said logic simulation method further comprises:

relating states of said algorithm level description and states of said register transfer level description to produce said relation.

27. A recording medium according to claim 26, wherein said relating includes:

producing said algorithm level model, a state transition diagram indicative of states of said algorithm level simulation, a variable table and a register/variable table indicative of variables set to registers for every state from said algorithm level description, said algorithm level simulation using said algorithm level model;

producing said register transfer level model, a register table and a variable table from said register transfer level description, said register transfer level simulation using said register transfer level model; and producing a control mechanism through said producing steps, wherein said control mechanism relates states of said algorithm level description and states of said register transfer level description such that values of said variables and values of said register are exchanged in said switching by referring to said state transition diagram, said register/variable table, said algorithm level model variable table, said register transfer level register table and said register transfer level variable table.

28. A recording medium storing a program for a logic simulation method which comprises:

executing one of an algorithm level simulation corresponding to an algorithm level description, a register transfer level simulation corresponding to a register transfer level description and a gate level simulation corresponding to a gate level description, said algorithm level description being associated with arithmetic and logic algorithm and not associated with logic circuits, and said register transfer level description and said gate level description being associated with logic circuits; and switching one of said algorithm level simulation and said register transfer level simulation into another in response to a switching instruction using a relation between states of said algorithm level description, states of said register transfer level description, and states of said gate level description, said relation comprising a state position of an algorithm level model produced from said algorithm level description and a state position of a register transfer level model produced from said register transfer level description having a same value set simultaneously.

29. A logic simulation system comprising:

a table of usable resources;

a function synthesizing section producing an algorithm level model, using said table of usable resources;

first compiling means for producing a state transition diagram indicative of states of said algorithm level simulation and a variable table and a register/variable table indicative of variables set to registers for every state from said algorithm level description, said algorithm level description being associated with arithmetic and logic algorithm and not associated with logic circuits;

second compiling means for producing a register transfer level model, and a register table from said register transfer level description, said register transfer level description being associated with logic circuits; and a control mechanism producing tool producing a control mechanism, such that said control mechanism executes one of an algorithm level simulation of said algorithm level model and a register transfer level simulation of a register transfer level model, and switches one of said algorithm level simulation and said register transfer level simulation into the other in response to a switching instruction using said state transition diagram, said register/variable table, and said register transfer level register table.

30. A logic simulation system according to claim 29, further comprising:

a logic synthesis tool producing a gate level description from said register transfer level description; and third compiling means for producing a gate level model, and a register table from said gate level description, said gate level description being associated with logic circuits, wherein said simulation control mechanism executes one of an algorithm level simulation of said algorithm level model, a register transfer level simulation of said register transfer level model and a gate level simulation of said gate level model, and switches one of said algorithm level simulation, said register transfer level simulation and said gate level simulation into another in response to said switching instruction using said state transition diagram, said register/variable table, said register transfer level register table, and said gate level register table.

* * * * *